US009786721B1

(12) United States Patent
Tang

(10) Patent No.: US 9,786,721 B1
(45) Date of Patent: Oct. 10, 2017

(54) OLED DISPLAY PANEL

(71) Applicant: Wuhan China Star Optoelectronics Technology Co., Ltd., Wuhan, Hubei (CN)

(72) Inventor: Yuejun Tang, Shenzhen (CN)

(73) Assignee: Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 0 days.

(21) Appl. No.: 15/186,466

(22) Filed: Jun. 18, 2016

(30) Foreign Application Priority Data

May 18, 2016 (CN) ..................... 2016 2 0456894 U

(51) Int. Cl.
*H01L 27/32* (2006.01)
*H01L 51/52* (2006.01)

(52) U.S. Cl.
CPC ........ *H01L 27/322* (2013.01); *H01L 27/3246* (2013.01); *H01L 27/3248* (2013.01); *H01L 51/5256* (2013.01); *H01L 51/5259* (2013.01)

(58) Field of Classification Search
CPC ............... H01L 27/322; H01L 27/3246; H01L 27/3248; H01L 51/5256; H01L 51/5259
See application file for complete search history.

(56) References Cited

U.S. PATENT DOCUMENTS

| | | | | |
|---|---|---|---|---|
| 7,649,311 B2 * | 1/2010 | Park | ...................... | H01L 27/322 257/E31.095 |
| 8,604,687 B2 * | 12/2013 | Wang | ...................... | H01L 27/322 313/504 |
| 8,969,904 B2 * | 3/2015 | Chao | ................... | H01L 51/0024 257/40 |
| 9,508,779 B2 * | 11/2016 | Cheng | ................. | H01L 51/0024 |
| 2006/0146033 A1 * | 7/2006 | Chen | ................... | G02F 1/13338 345/173 |
| 2014/0190621 A1 * | 7/2014 | Kawata | .................. | B32B 38/10 156/155 |
| 2015/0123085 A1 * | 5/2015 | Kim | ..................... | H01L 51/5284 257/40 |
| 2015/0194392 A1 * | 7/2015 | Kawata | ................. | H01L 21/022 257/644 |
| 2015/0249120 A1 * | 9/2015 | Cheng | ..................... | H01L 51/56 257/40 |
| 2015/0325632 A1 * | 11/2015 | Cheng | ................. | H01L 51/0024 257/40 |
| 2015/0380671 A1 * | 12/2015 | Shu | ................... | G02F 1/133617 257/13 |
| 2016/0020259 A1 * | 1/2016 | Cheng | ................... | H01L 27/326 257/40 |
| 2016/0036004 A1 * | 2/2016 | Cheng | ................. | H01L 51/5253 257/40 |
| 2016/0087018 A1 * | 3/2016 | Shim | ................... | H01L 51/5284 257/40 |
| 2016/0093677 A1 * | 3/2016 | Tseng | ...................... | G02B 5/201 362/84 |

(Continued)

*Primary Examiner* — Ida M Soward

(74) *Attorney, Agent, or Firm* — Andrew C. Cheng

(57) ABSTRACT

The utility model provides an OLED display panel, by disposing a color filter layer on an array substrate, an alignment process of an upper with a lower substrate can be omitted, the manufacturing process of the OLED display panel can be simplified, and a thin film packaging can be carried out on the color filter layer so that the OLED display panel can become more lightweight and thin.

2 Claims, 4 Drawing Sheets

(56) References Cited

U.S. PATENT DOCUMENTS

| | | | |
|---|---|---|---|
| 2016/0116794 A1* | 4/2016 | Song | G02F 1/133345 |
| | | | 349/43 |
| 2016/0246111 A1* | 8/2016 | Chen | H04N 9/12 |
| 2016/0276617 A1* | 9/2016 | Qi | H01L 51/5212 |
| 2016/0315283 A1* | 10/2016 | Kim | H01L 27/3246 |
| 2016/0322437 A1* | 11/2016 | Sakamoto | H01L 27/3246 |
| 2016/0372532 A1* | 12/2016 | Song | H01L 27/322 |
| 2017/0016930 A1* | 1/2017 | Qiu | G01P 15/0802 |

\* cited by examiner

OLED DISPLAY PANEL

TECHNICAL FIELD

The utility model relates to the field of display technology, and more particularly to an OLED display panel.

DESCRIPTION OF RELATED ART

An organic light-emitting diode (OLED) has self-luminous capability and therefore there is no need of a backlight source and meanwhile has outstanding characteristics of high contrast, thinness, wide viewing angle, fast response, applicable to flexible panels, wide operating temperature range, simple structure and so on and thus is known as a new technology for the next generation of flat panel display device.

At present, a conventional OLED display panel includes an array substrate and a color filter. A light-emitting layer is disposed on the array substrate, and white light emitted from a light-emitting device located in the light-emitting layer would pass through the color filter so as to achieve a RGB three-primary color display. Therefore, the conventional white light OLED display panel needs to be used in conjunction with the upper substrate of color filter so as to achieve the RGB three-primary color display, the upper substrate and the lower substrate need to be aligned and bonded together with each other, which go against the thin film encapsulation of OLED display panel to realize the purpose of lightweight and thin, so that the thickness of the OLED display panel is relatively large.

SUMMARY

Accordingly, the utility model provides an OLED display panel, by disposing a color filter layer on an array substrate, an alignment process of an upper substrate with a lower substrate can be omitted and the OLED display panel can reach to be lightweight and thin.

In order to solve the above technical issues, the utility model provides an OLED display panel including an array substrate and a color filter layer, and the color filter layer being disposed on the array substrate.

In an embodiment, the array substrate includes a cathode layer disposed on the top of the array substrate, and the color filter layer is disposed on the cathode layer.

In an embodiment, a second thin film layer is disposed on a surface of the color filter layer away from the cathode layer.

In an embodiment, a first thin film layer further is disposed between the cathode layer and the color filter layer.

In an embodiment, the first thin film layer and the second thin film layer each are a plurality of organic and inorganic layers being alternately stacked.

In an embodiment, the organic layer includes a single layer or a stacked layer formed by polyethylene terephthalate, polyimide, polycarbonate, an epoxy resin, polyethylene and/or polyacrylate. The inorganic layer includes a single layer or a stacked layer formed by a metal oxide(s) or a metal nitride(s).

In an embodiment, the color filter layer includes an R photoresist, a G photoresist and a B photoresist adjacent to one after another.

In an embodiment, the array substrate includes: a base substrate; a buffer layer disposed on the base substrate; a plurality of TFTs disposed on the buffer layer; a planarization layer disposed on the plurality of TFTs and disposed with via holes; an anode layer disposed discontinuously on the planarization layer and connected to the plurality of TFTs by the via holes; a light-emitting layer disposed on the anode layer, and a pixel defining layer disposed adjacent to the light-emitting layer.

In an embodiment, any adjacent two of the R photoresist, the G photoresist and the B photoresist have a black matrix disposed therebetween, and the black matrix is disposed opposite to the pixel defining layer.

In an embodiment, the array substrate further includes a package cover plate disposed on the second thin film layer.

By way of the above solutions, efficacy can be achieved by the utility model is that: distinguished from the prior art, the OLED display panel associated with the utility model, by disposing the color filter layer on the cathode layer of the array substrate, the OLED display panel can omit/avoid an alignment process of an upper substrate with a lower substrate, the manufacturing process thereof can be simplified, and a thin film packaging can be performed on the color filter layer so that the OLED display panel can become more lightweight and thin.

BRIEF DESCRIPTION OF THE DRAWINGS

The above and other aspects, features and advantages of embodiments of the utility model will be more apparent from the following detailed description taken in conjunction with the accompanying drawings, in which.

DETAILED DESCRIPTION OF EMBODIMENTS

In the following, various embodiments of the utility model will be described in detail with reference to accompanying drawings. The utility model may be embodied in many different forms and should not be construed as limiting to the embodiments set forth herein. Rather, these embodiments are provided to explain the principles of the utility model and its practical applications, so that other skilled in the art can understand various embodiments of the utility model and various modifications suitable for specific intended applications.

Figure 1:
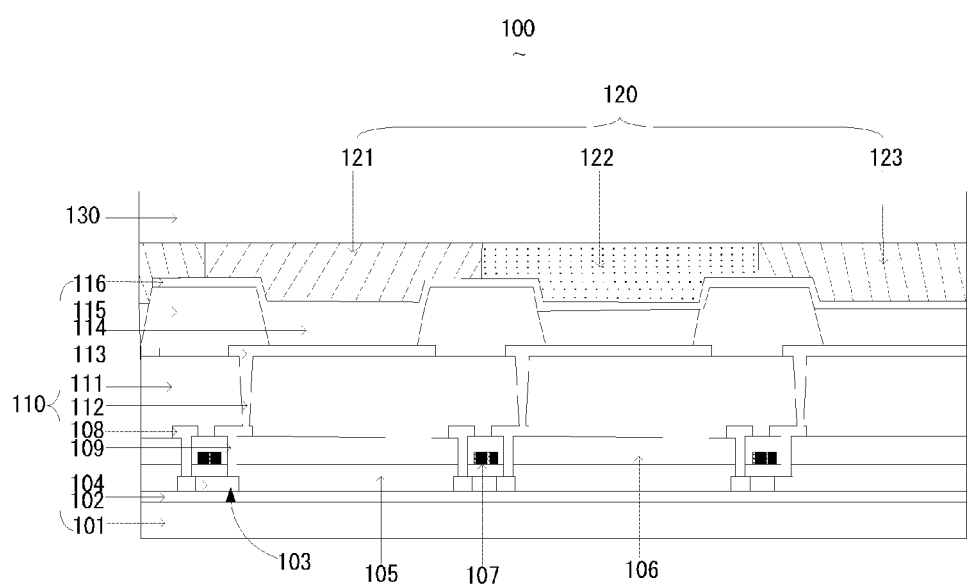
FIG. 1 is a schematic sectional view of an OLED display panel according to a first embodiment of the utility model.

Please refer to FIG. 1, which is a schematic sectional view of an OLED display panel according to a first embodiment of the utility model. As shown in FIG. 1, the OLED display panel of the illustrated embodiment includes an array substrate 110 and a color filter layer 120 disposed on the array substrate 110 e.g., as a part of the array substrate 110. A material of the color filter layer 120 includes but is not limited to a resin. The resin is an organic material, can play a role of color filtering and has a high elasticity. A cathode layer 116 is disposed on the top of the array substrate 110, and the color filter layer 120 is disposed on the cathode layer 116.

In the illustrated embodiment, the array substrate 110 is a conventional top-gate type TFT (thin film transistor) array substrate and includes: a base substrate 101, a buffer layer 102 disposed on the base substrate 101 and a plurality of TFTs 103 disposed on the buffer layer 102. Herein, the TFTs 103 refer to a thin film transistor active matrix. The TFTs 103 each include a semiconductor layer 104 disposed on the buffer layer 102, a gate insulating layer 105 disposed on the buffer layer 102 and covering the semiconductor layer 104, a gate electrode 107 disposed on the gate insulating layer 105, and a source electrode 108 and a drain electrode 109 respectively disposed on two sides of the semiconductor layer 104.

In other embodiment, the TFTs 103 each may be a conventional thin film transistor with bottom-gate structure instead and thus will not be repeated herein.

In addition, the array substrate 110 further includes a planarization layer 111, an anode layer 113, a light-emitting layer 114, a pixel defining layer 115 and the cathode layer 116 all disposed on the plurality of TFTs 103. An interlayer insulating layer 106 is disposed between the planarization layer 111 and the gate insulating layer 105. The interlayer insulating layer 106 is disposed covering a gate electrode 107 and on the gate insulating layer 105. The planarization layer 111 is disposed on the interlayer insulating layer 106 and covering the source electrode 108 as well as the drain electrode 109. A plurality of via holes are formed/disposed on the planarization layer 111. The anode layer 113 is discontinuously disposed on (e.g., penetrating through) the planarization layer 111, and the anode layer 113 is electrically connected to the drain electrode 109 of each TFT 103 by a corresponding one of the via holes 112 disposed on the planarization layer 111. In some embodiment, the anode layer 113 is a reflective film formed by one or more than one of gold (Au), platinum (Pt), nickel (Ni), tungsten (W), chromium (Cr), molybdenum (Mo), iron (Fe), cobalt (Co), copper (Cu), palladium (Pd), titanium (Ti) and their compounds. In other embodiment, the anode layer 113 may include at least one transparent film formed by a compound with high work function such as ITO (indium tin oxide), IZO (indium zinc oxide), AZO (aluminum-doped zinc oxide) or ZnO (zinc oxide). The array substrate 110 is disposed with the plurality of TFTs 103, the planarization layer 111 is disposed with the plurality of via holes 112, and the anode layer 113 is electrically connected to the TFTs 103 by respective via holes 112.

The light-emitting layer 114 correspondingly is disposed above the anode layer 113. The pixel defining layer 115 and the light-emitting layer 114 are disposed adjacent to and alternate with each other. In some embodiment, the cathode layer 116 is formed on the light-emitting layer 114 and the pixel defining layer 115. The cathode layer 116 contains a transparent metal, and the transparent metal may be constituted by a metal mixture with low work function of Mg (magnesium) and Ag (silver), LiF (lithium fluoride) and Al (aluminum), or Li (lithium) and Al (aluminum), or constituted by metals such as Li (lithium), Ca (calcium), Ag (silver) and Al (aluminum).

The color filter layer 120 is disposed on the cathode layer 160. The color filter layer 120 includes an R photoresist (red photoresist) 121, a G photoresist (green photoresist) 122 and a B photoresist (blue photoresist) 123 disposed adjacent to one after another. The R photoresist 121, the G photoresist 122 and the B photoresist 123 are disposed corresponding to respective discrete portions of the light-emitting layer 114. Preferably, a thickness of the color filter layer 120 is greater than or equal to a thickness of the pixel defining layer 115.

In addition, in other embodiment, in order to increase the brightness of the OLED display panel 100, the color filter layer 120 may further include a white light transmissive region (not shown in the drawings).

The OLED display panel 100 further includes a second thin film layer 130 disposed on a surface of the color filter layer 120 away from the cathode layer 116. The second thin film layer 130 is used for encapsulating/packaging the OLED display panel 100, so as to avoid the OLED display panel 110 to be affected by external environment and relieve performance degradation of the OLED display panel caused by moisture and oxygen.

Sum up, the illustrated embodiment disposes the color filter layer 120 on the cathode layer 116 of the array substrate 110, which can omit/avoid an alignment process of an upper substrate with a lower substrate, simplify the manufacturing process of the OLED display panel 100, and realize a thin film encapsulation/packaging on the color filter layer 120 to thereby make the OLED display panel 100 be more lightweight and thin.

Figure 2:
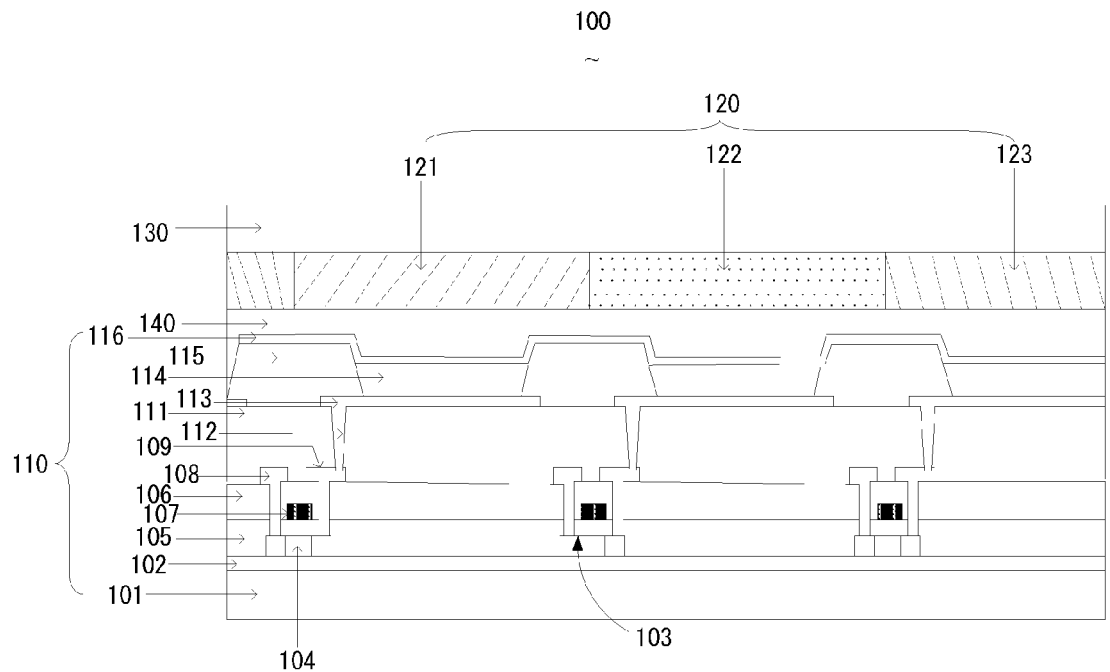
FIG. 2 is a schematic sectional view of an OLED display panel according to a second embodiment of the utility model.

Referring to FIG. 2, which is a schematic sectional view of an OLED display panel according to a second embodiment of the utility model. A main difference between the present embodiment and the first embodiment is that a first thin film layer 140 is disposed between the cathode layer 116 and the color filter layer 120.

Figure 5:
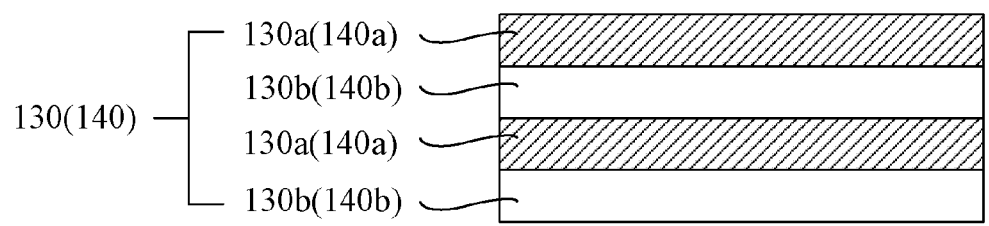
FIG. 5 is a schematic sectional view of the first thin film layer 140 or the second thin film layer 130 according to an embodiment of the utility model.

As shown in FIG. 1 and FIG. 2, the first thin film layer 140 and the second thin film layer 130 of the OLED display panels 100 in the first embodiment and the second embodiment each are a plurality of organic layers (140a and 130a, or alternatively, 140b and 130b shown in FIG. 5) and inorganic layers (140b and 130b, or alternatively, 140a and 130a shown in FIG. 5) being alternately stacked. The organic layer includes a single layer or a stacked layer formed by polyethylene terephthalate, polyimide, polycarbonate, an epoxy resin, polyethylene and/or polyacrylate. The inorganic layer includes a single layer or a stacked layer formed by a metal oxide(s) or a metal nitride(s), for example, the inorganic layer may include any one of $SiN_x$ (silicon nitride), $Al_2O_3$ (aluminum oxide), $SiO_2$ (silicon oxide) and $TiO_2$ (titanium dioxide). Therefore, by disposing the first thin film layer 140 and the second thin film layer 130 on the OLED display panel 100, which can avoid the OLED display panel 100 to be affected by external environment and relieve performance degradation of the OLED display panel caused by moisture and oxygen.

In addition, a buffer layer (not shown in the drawing) may be disposed between the cathode layer 116 and the color filter layer 120. A material of the buffer layer includes but is not limited to any one of $TiO_2$ (titanium dioxide), $SiN_x$ (silicon nitride) and $SiO_x$ (silicon oxide) or a combination thereof. By setting the buffer layer, the first thin film layer 140 is not easy to be damage during a process of forming the color filter layer 120.

Figure 3:
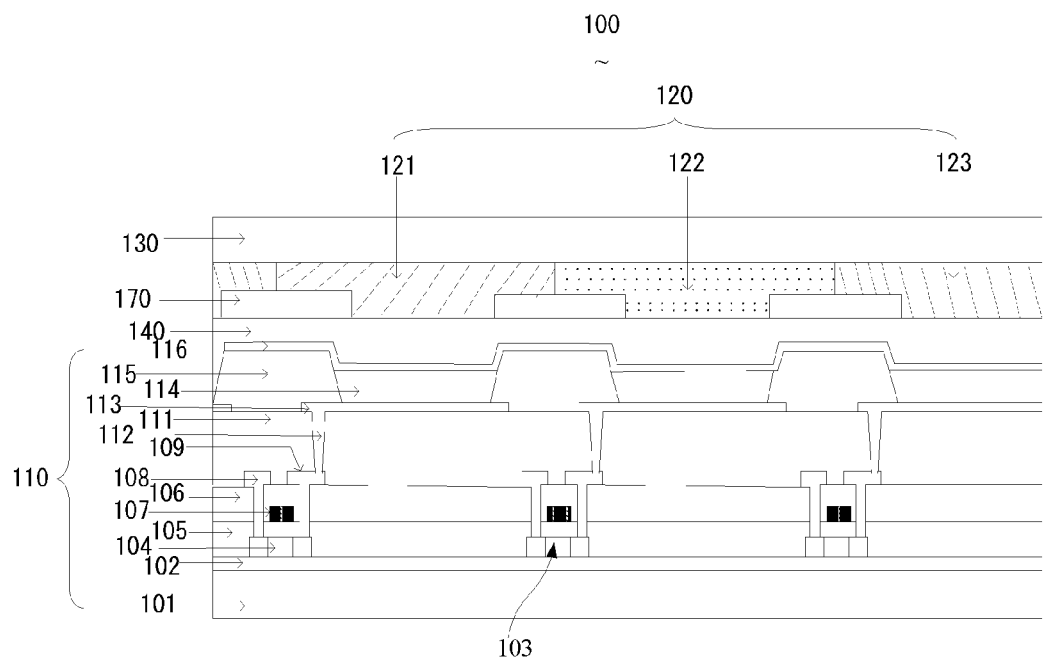
FIG. 3 is a schematic sectional view of an OLED display panel according to a third embodiment of the utility model.

Please further refer to FIG. 3, which is a schematic sectional view of an OLED display panel according to a third embodiment of the utility model. A main difference between the OLED display panel 100 as shown in FIG. 3 and the OLED display panel 100 of the embodiment associated with FIG. 2 is that: in the OLED display panel 100 of the embodiment associated with FIG. 3, each adjacent two of the R photoresist 121, the G photoresist 122 and the B photoresist 123 of the color filter layer 120 are disposed with a black matrix 170 therebetween. The black matrix 170 and the pixel defining layer 115 are disposed opposite to each other, and the effect of the black matrix 170 is for blocking light rays directed to two sides of each photoresist in the color filter layer 120 and emitted from a light-emitting region of a white organic light-emitting diode in the light-emitting layer 114, and thereby avoiding a color mixing phenomenon. Preferably, a thickness of the black matrix 170 is less than or equal to a thickness of the color filter layer 120.

Figure 4:
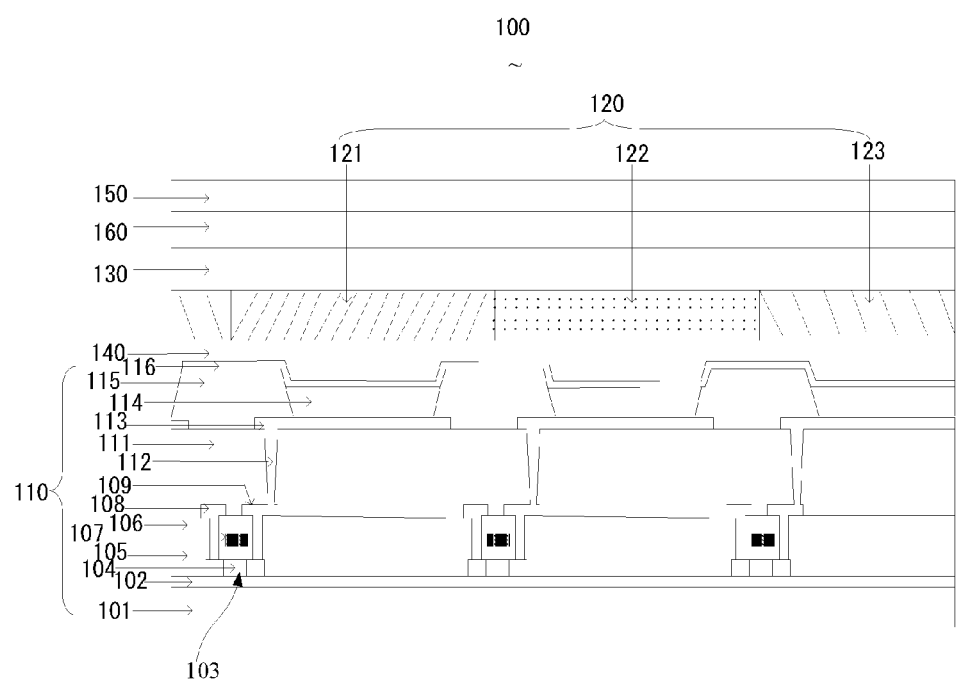
FIG. 4 is a schematic sectional view of an OLED display panel according to a fourth embodiment of the utility model.

Please further refer to FIG. 2 and FIG. 4 together, FIG. 4 is a schematic sectional view of an OLED display panel according to a fourth embodiment of the utility model. A main difference between the embodiment of FIG. 4 and the embodiment of FIG. 2 is that: a package cover plate 150 further is disposed on the second thin film layer 130, and a desiccant 160 is disposed between the package cover plate 150 and the second thin film layer 130. The desiccant 160 is used for absorbing moisture of the OLED display panel 100, and a material of the desiccant 160 may be anhydrous copper sulfate, anhydrous cobalt chloride, glycerol, trimethylolpropane, triethanolamine, ethylene glycol or any other material can absorb moisture. The package cover plate 150 is used for blocking penetration of external moisture and oxygen.

The OLED display panel of any one of the above embodiments may be applied to mobile phones, tablet PCs, televisions, monitors, navigators and other display devices with displaying function.

In summary, as to the OLED display panel of the utility model, by disposing the color filter layer on the array substrate, the OLED display panel can omit/avoid an alignment process of upper and lower substrates, a manufacturing process thereof can be simplified, and a thin film encapsulation/packaging can be performed on the color filter layer so that the OLED display panel can become more light-weight and thin.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An OLED display panel comprising an array substrate and a color filter layer, the color filter layer being disposed on the array substrate, wherein the array substrate comprises a cathode layer disposed on the top of the array substrate, the color filter layer is disposed on the cathode layer, a surface of the color filter layer away from the cathode layer is disposed with a second thin film layer thereon, a first thin film layer is disposed between the cathode layer and the color filter layer, and the first thin film layer and the second thin film layer each are a plurality of organic and inorganic layers being alternately stacked.

2. The OLED display panel according to claim 1, wherein the organic layer comprises a single layer or a stacked layer formed by polyethylene terephthalate, polyimide, polycarbonate, an epoxy resin, polyethylene, and/or polyacrylate; the inorganic layer comprises a single layer or a stacked layer formed by a metal oxide(s) or a metal nitride(s).

* * * * *